United States Patent
Sakai et al.

(10) Patent No.: US 6,797,544 B2
(45) Date of Patent: Sep. 28, 2004

(54) SEMICONDUCTOR DEVICE, METHOD OF MANUFACTURING THE DEVICE AND METHOD OF MOUNTING THE DEVICE

(75) Inventors: Tadahiko Sakai, Fukuoka (JP); Mitsuru Ozono, Fukuoka (JP); Tadashi Maeda, Saga (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 159 days.

(21) Appl. No.: 09/977,220

(22) Filed: Oct. 16, 2001

(65) Prior Publication Data

US 2002/0048906 A1 Apr. 25, 2002

(30) Foreign Application Priority Data

Oct. 20, 2000 (JP) ........................................ 2000-320619
Nov. 2, 2000 (JP) ........................................ 2000-335492

(51) Int. Cl.[7] .......................... H01L 21/44; H01L 23/48
(52) U.S. Cl. ..................... 438/121; 438/720; 438/718; 438/123; 438/126; 438/127; 438/612; 438/617; 257/738; 257/737; 257/787; 257/786; 257/784; 257/692; 257/780
(58) Field of Search ................................ 438/121, 720, 438/718, 123, 126, 106, 110, 127, 617, 612–616; 257/738, 692, 737, 784, 786, 780, 787

(56) References Cited

U.S. PATENT DOCUMENTS 4,722,130 A    2/1988  Kimura et al.
5,445,692 A  *  8/1995  Nitta ............................. 156/87
5,851,845 A  * 12/1998  Wood et al. ................... 438/15
6,101,237 A  *  8/2000  Miyachi et al. ............... 378/35
6,184,064 B1 *  2/2001  Jiang et al. .................. 438/113
6,280,828 B1 *  8/2001  Nakatsuka et al. .......... 428/209
6,429,506 B1 *  8/2002  Fujii et al. ................... 257/620

FOREIGN PATENT DOCUMENTS

| CN | 1350701 | 5/2002 | |
|---|---|---|---|
| JP | 10-135386 | 5/1998 | |
| JP | 11126856 A | * 5/1999 | ........... H01L/23/36 |
| JP | 11-260945 | 9/1999 | |
| WO | 00/68990 | 11/2000 | |

* cited by examiner

*Primary Examiner*—Matthew Smith
*Assistant Examiner*—Igwe U. Anya
(74) *Attorney, Agent, or Firm*—Wenderoth, Lind & Ponack, L.L.P.

(57) ABSTRACT

A semiconductor device having a thinned semiconductor element that can be easily handled is manufactured with a method of manufacturing. The semiconductor device includes a semiconductor element and a bumper member bonded, as a reinforcing member, to a back surface opposite to an electrode-formed surface of the semiconductor element with an adhesive. The adhesive has a low elastic modulus and easily expands and contracts after bonding, and bonds the semiconductor element to the bumper member while allowing the semiconductor element to be deformed. Thus, the semiconductor device can be easily handled, and the semiconductor element can be deformed in response to the deformation of a substrate after being mounted. In addition, a thermal stress in a heat cycle can be alleviated effectively.

23 Claims, 18 Drawing Sheets

SEMICONDUCTOR DEVICE, METHOD OF MANUFACTURING THE DEVICE AND METHOD OF MOUNTING THE DEVICE

FIELD OF THE INVENTION

The present invention relates to a semiconductor device including a semiconductor element and a reinforcing member bonded to a back surface opposite to an electrode-formed surface of the element with an adhesive and also relates to a method of manufacturing the device and a method of mounting the device.

BACKGROUND OF THE INVENTION

A semiconductor device mounted to electronic equipment is manufactured through a packaging process of connecting pins, metallic bumps or the like of a lead frame to a semiconductor element in the form of a wafer on which a circuit pattern is formed and of sealing the element with resin or the like. With recent miniaturization of the electronic equipment, the size of semiconductor devices has become small and the semiconductor element has become thin.

The thinned semiconductor element is susceptible to damage during handling because of low strength of the element against external force. Accordingly, a conventional semiconductor device has the thinned semiconductor element generally sealed with a layer of resin for reinforcement.

In a process of forming the resin layer on the surface of the thin semiconductor element, contraction and shrinkage of the resin layer likely cause problems such as warpage and fracture to the semiconductor element. The problem becomes more apparent as the semiconductor element is thinned. For example, an extremely thin semiconductor element having a thickness of 100 $\mu$m or less is hardly sealed with resin.

SUMMARY OF THE INVENTION

A semiconductor device includes a semiconductor element having an electrode-formed surface including an electrode for external connection formed thereon, and a reinforcing member bonded to a back surface opposite to the electrode-formed surface with an adhesive. The adhesive bonds the semiconductor element with the reinforcing member while allowing the semiconductor element to be deformed.

A method of manufacturing the semiconductor device includes a process of: shaving a back surface of a semiconductor wafer including plural semiconductor elements formed therein to thin the semiconductor wafer, a process of bonding a reinforcing member to the back surface of the thinned semiconductor wafer with an adhesive, and a process of dividing the semiconductor wafer and the reinforcing member stuck to the wafer into units of the semiconductor elements.

Another method of manufacturing the semiconductor device includes a process of: forming a diced groove along a respective border of plural semiconductor elements from an electrode-formed surface of a semiconductor wafer including the semiconductor elements formed therein, a process of attaching a sheet to the electrode-formed surface of the semiconductor wafer including the diced grooves formed thereon, a process of diving the semiconductor wafer into units of the semiconductor elements through shaving a back surface of the semiconductor wafer with the sheet attached thereto to thin the semiconductor wafer to a thickness until the back surface reaches the diced groove, a process of bonding a reinforcing plate to a back surface of each semiconductor element with an adhesive, and a process of dividing the reinforcing plate into units of the semiconductor elements after removing the sheet from the electrode-formed surface.

Still another method of manufacturing the semiconductor device includes a process of shaving a back surface of a semiconductor wafer including plural semiconductor elements, a process of dividing the semiconductor wafer into the semiconductor elements, and a process of bonding a reinforcing member to a back surface of each semiconductor element with an adhesive.

The semiconductor device has a semiconductor element that is handled easily and has an increased reliability after being mounted.

DESCRIPTION OF THE PREFERRED EMBODIMENTS (Exemplary Embodiment 1)

Figure 3:
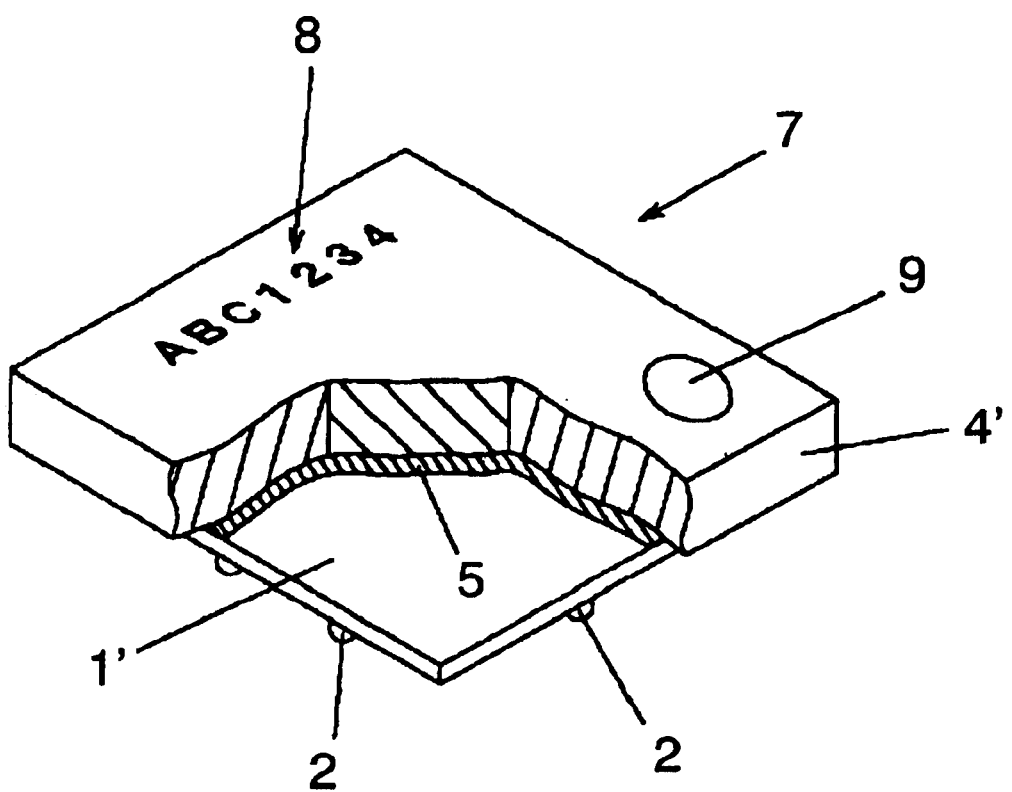
FIG. 3 is a perspective view of the semiconductor device in accordance with the embodiment 1.
Figure 4A:
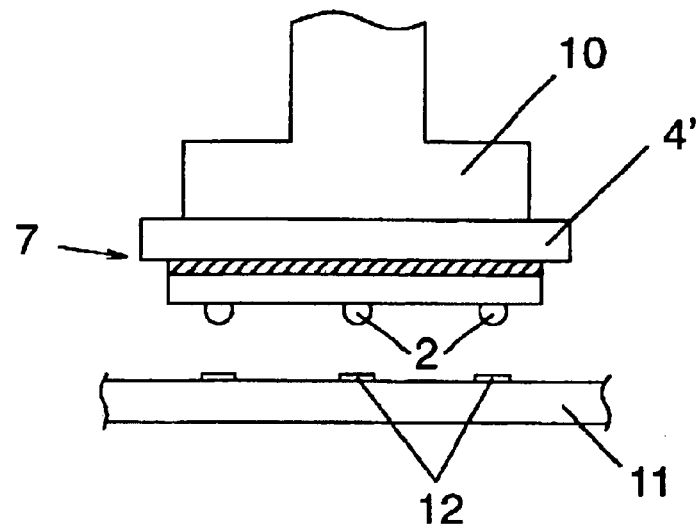
FIG. 4A through FIG. 4C illustrate processes of mounting the semiconductor device in accordance with the embodiment 1.
Figure 4B:
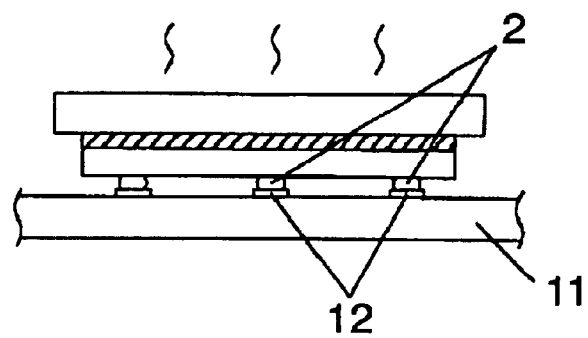
Figure 4C:
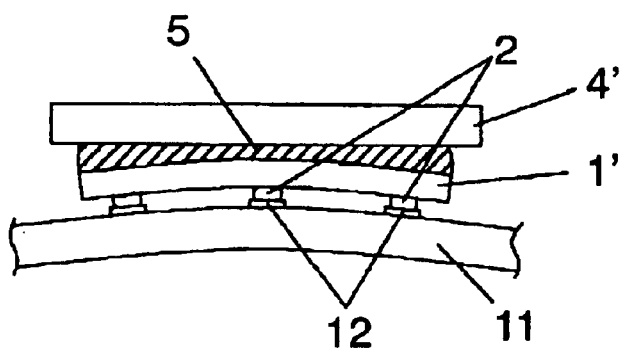

FIG. 1A through FIG. 1D and FIG. 2A through FIG. 2C illustrate processes in a method of manufacturing a semiconductor device in accordance with an exemplary embodiment 1. FIG. 3 is a perspective view of the semiconductor device, and FIG. 4A through FIG. 4C illustrate processes of mounting the device. FIG. 1A through FIG. 1D and FIG. 2A through FIG. 2C illustrate the method of manufacturing the semiconductor device in order of procedure of the method.

Figure 1A:
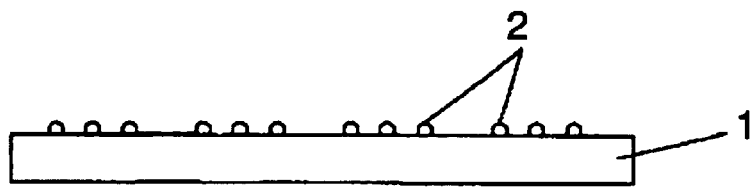
FIG. 1A through FIG. 1D illustrate processes in a method of manufacturing a semiconductor device in accordance with an exemplary embodiment 1 of the present invention.
Figure 1B:
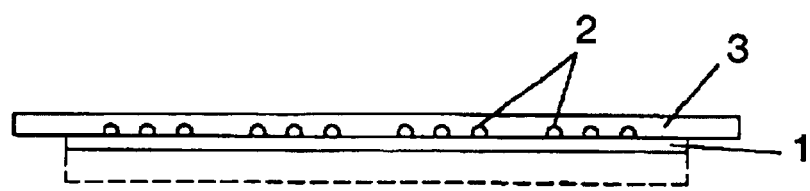

In FIG. 1A, bumps 2, electrodes for external connections, are formed on a top surface of a semiconductor wafer 1 in which plural semiconductor elements are formed. As shown in FIG. 1B, a sheet 3 is attached to a bump-formed surface (electrode-formed surface), which is the top surface of the wafer 1, and then, the wafer 1 has a back surface opposite the electrode-formed surface thinned while being reinforced with the sheet 3. The back surface is thinned by shaving with a polishing machine having a grinding wheel, by etching with a dry etching apparatus, or by etching with utilizing a chemical reaction of a chemical solution. The wafer 1 is thus thinned to have a thickness of about 50 $\mu$m.

Figure 1C:
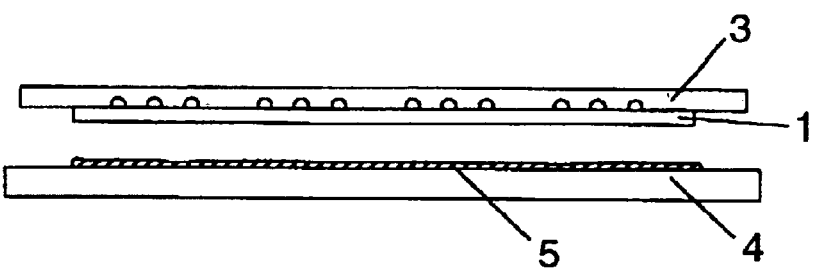

Subsequently, a bumper plate 4 is stuck to the back surface of the thinned semiconductor wafer 1. As shown in FIG. 1C, an adhesive 5 is applied to a top surface of a bumper plate 4 formed by shaping a material such as resin, ceramic, metal or the like into a plate. The adhesive 5 is a resin adhesive having a low elastic modulus, and is made of material such as elastomer having a low elastic modulus in bonding for being easily expanded and contracted with a small external force.

Figure 1D:
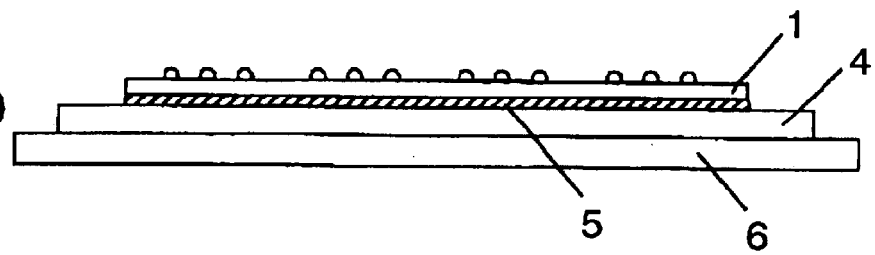

The bumper plate 4 functions as a holding member during handling of the semiconductor device after the semiconductor elements are separated from one another to form the semiconductor devices, respectively, and also functions as a reinforcing member to protect the semiconductor elements from an external force and impact. Accordingly, the bumper plate 4 has an enough thickness to exhibit a greater flexural rigidity than the semiconductor element. After the bumper plate 4 is attached to the wafer 1, as shown in FIG. 1D, a holding sheet 6 used in a dicing process is attached to an undersurface of the bumper plate 4, and then the sheet 3 is peeled from the electrode-formed surface.

The bumper plate 4 and semiconductor wafer 1 both held by the sheet 6 are processed in the dicing process. In the process shown in FIG. 2A, a two-stage dicing is performed to cut the bumper plate 4 and wafer 1 along different dicing widths, respectively. Specifically, the wafer 1 is cut with a dicing width b1 to be divided into discrete semiconductor elements 1', while the bumper plate 4 is cut with a dicing width b2 narrower than the width b1 to be divided into discrete bumper members 4'.

Figure 2A:
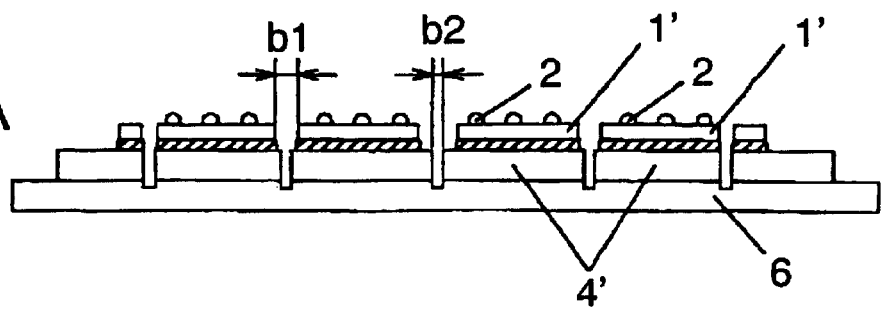
FIG. 2A through FIG. 2C illustrate processes in the manufacturing method of the semiconductor device in accordance with the embodiment 1.
Figure 2B:
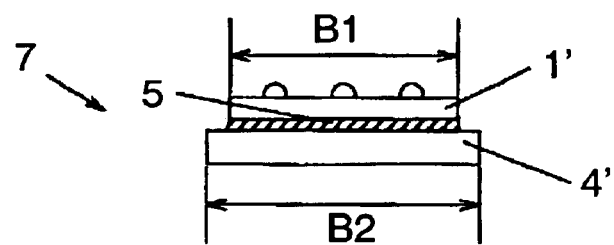
Figure 2C:
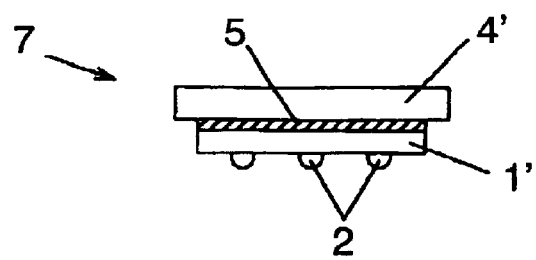

Then, the sheet 6 is peeled from bumper members 4' which are bonded to respective semiconductor element 1' with the adhesive 5, and thus, discrete semiconductor devices 7, one of which is shown in FIG. 2B, are provided. Each semiconductor device 7 includes the semiconductor element 1' having bumps 2 functioning as electrodes for external connections, and bumper member 4' functioning as a reinforcing member bonded to a back surface opposite to an electrode-formed surface of the element 1' with the adhesive 5. A size B2 of the bumper member 4' is larger than a size B1 of the semiconductor element 1', and outer edges of the bumper member 4' protrude further outward than outer edges of the semiconductor element 1'. The adhesive 5, since being the resin adhesive having low elastic modulus, bonds the semiconductor element 1' to the bumper member 4' while allowing the element 1' to be deformed.

As shown in FIG. 3, the bumper member 4' including a part code 8 as identification information printed on the top surface of the member 4', and a polarizing mark 9 indicative of a mounting direction printed at the corner similarly to a conventional resin-sealed electronic component. In other words, the bumper member 4' has a reverse surface opposite to a bonded surface of the member 4' and the semiconductor element 1', and the reverse surface is an applied-surface to which the identification information is applied. Then, a discrete semiconductor device 7 is inverted to have the bumper member 4' face upward, and then is subjected to a taping process to be stored on a tape for supplying electronic components to an automatic-electronic-component-mounting apparatus. Thus, the device 7 can be mounted with the mounting apparatus.

Instead of the semiconductor element 1', a dummy semiconductor device made of a silicon plate having a thickness of 50 $\mu$m was subjected to a drop test in which the device was dropped from a height of 1 m. As a result, damage such as fracture or the like did not occur to the silicon plate at all. According to this fact, it is confirmed that the semiconductor device in accordance with the present embodiment has no problem even if being handled in the same manner as an ordinary electronic component. Therefore, the semiconductor device 7 can employ an extremely thin semiconductor element, which is hardly handled upon being used in a conventional resin-sealed device, because the device 7 has a simple structure in which bumper member 4' is simply bonded to the semiconductor element 1' with the adhesive 5.

Mounting the semiconductor device 7 will be explained hereinafter by referring to FIG. 4A through FIG. 4C. As shown in FIG. 4A, the device 7 has a top surface of the bumper member 4' sucked and held by a mounting head 10, and then, the device 7 is positioned above a substrate 11 by the head 10. After aligning the bumps 2 of the device 7 with respective electrodes 12 on the substrate 11, the mounting head 10 is then lowered to mount each bump 2 of the semiconductor element 1' on each electrode 12.

Subsequently, the substrate 11, with being heated, has the electrodes 12 bonded to the bumps 2 by soldering. As described above, the mounting head 10 holds the bumper member 4' as the holding member while the semiconductor device 7 is handled to be mounted on the substrate 11. The bumps 2 may be bonded to the respective electrodes 12 by a conductive resin adhesive.

In an assembly including the semiconductor device 7 mounted on the substrate 11, the device 7, for being fixed to the substrate 11, has the bumps 2 bonded to respective electrodes 12 of the substrate 11 as a workpiece. The semiconductor element 1' is thin and is easily bent, and the low elastic modulus material that is easy deformed is used for the adhesive 5. Therefore, as shown in FIG. 4C, when the substrate 11 is deformed by an external force after the mounting, only the semiconductor element 1' and an adhesive layer of the adhesive 5 are deformed in response to the deformation of the substrate 11.

Moreover, since the extremely thin semiconductor element has a thickness of 100 $\mu$m or less in the semiconductor device in accordance with this embodiment, a stress on the bumps 2 due to a difference between thermal expansion coefficients of the element 1' and substrate 11 is reduced. A conventional electronic component (semiconductor device) having a bump, since employing a thick semiconductor element. accepts an excessive stress on the bump that is high enough to be able to break the bump. For this reason, an underfill resin or the like is needed for reinforcing between the electronic component having the bump and a substrate. However, the extremely thin semiconductor element 1', after being mounted, reduces the stress on a junction of the device 7 and substrate 11 without reinforcement such as the underfill resin. In addition, the semiconductor device has a simple package structure including the semiconductor element 1' and bumper member 4' both simply bonded with the adhesive 5, thus having an ensured reliability after the mounting.

(Exemplary Embodiment 2)

FIG. 5A through FIG. 5D and FIG. 6A through FIG. 6D illustrate processes in a method of manufacturing a semiconductor device in accordance with an exemplary embodiment 2 in order of procedure of the method.

Figure 5A:
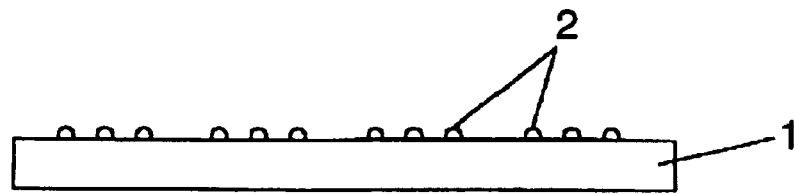
FIG. 5A through FIG. 5D illustrate processes in a method of manufacturing a semiconductor device in accordance with an exemplary embodiment 2 of the invention.
Figure 5B:
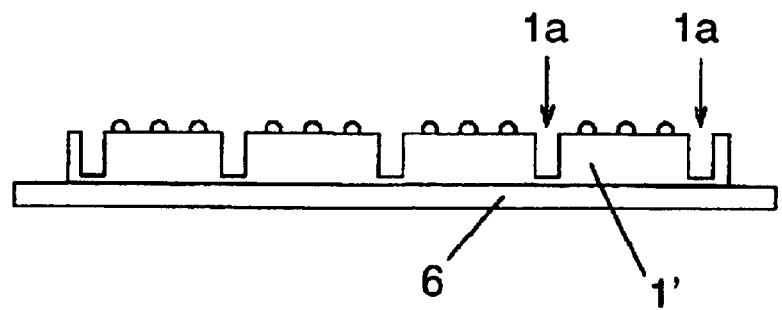
Figure 5C:
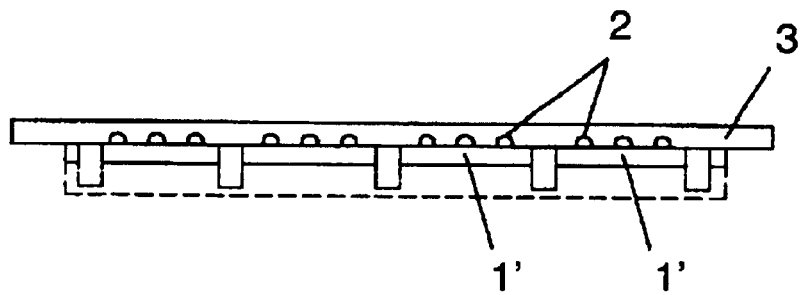

In FIG. 5A, bumps 2 for external connections are formed on a top surface of a semiconductor wafer 1 including plural semiconductor elements formed therein. A sheet 6 is then attached to an undersurface of the wafer 1. As shown in FIG. 5B, the wafer 1 is diced while being held by the sheet 6 to from grooves 1a along respective borders of semiconductor elements 1'. A reinforcing sheet 3 for a thinning process is attached to bump-formed surfaces of the elements 1', and then, the sheet 6 is removed. Then, the element 1', upon being reinforced with the sheet 3, has a set of back surfaces opposite to the bump-formed surfaces 1' thinned. Each element 1' is thinned to a thickness of about 50 μm and separated from one another along diced grooves 1a.

Figure 5D:
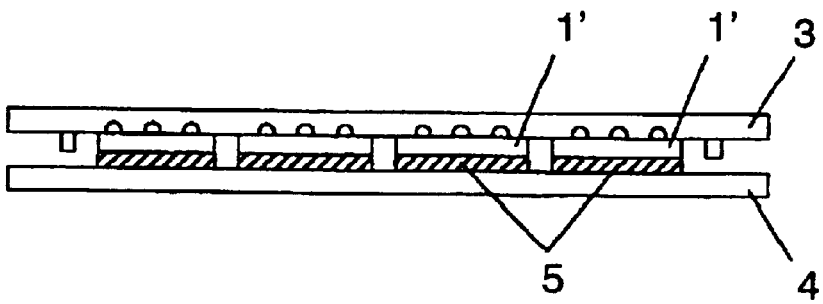

Subsequently, as shown in FIG. 5D, the element 1' are stuck to a bumper plate 4 with an adhesive 5 applied to a top surface of the bumper plate 4 similarly to the embodiment 1. Then, the thinned semiconductor element 1' is stuck to a surface coated with the adhesive 5. The adhesive 5 is made of the same material as that described in the embodiment 1.

Figure 6A:
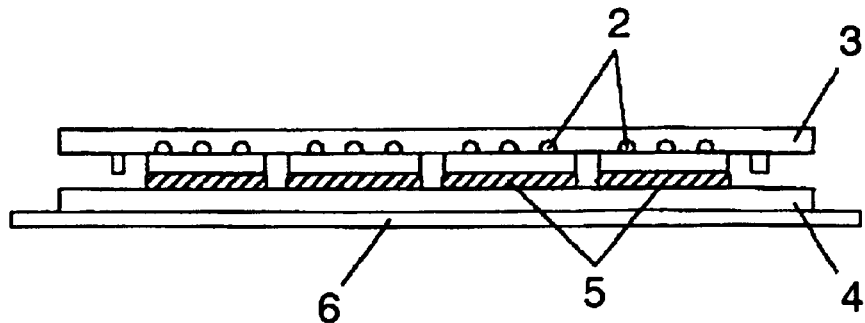
FIG. 6A through FIG. 6D illustrate processes in the method of manufacturing the semiconductor device in accordance with the embodiment 2.
Figure 6B:
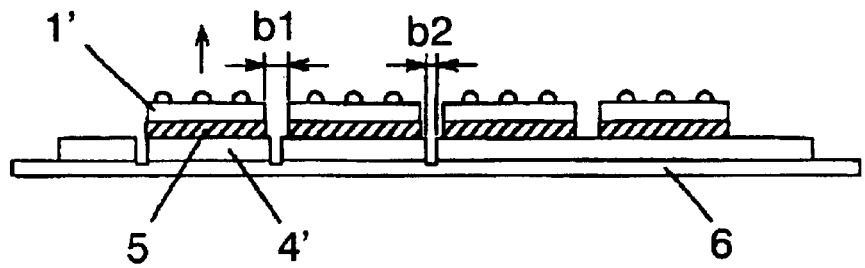
Figure 6C:
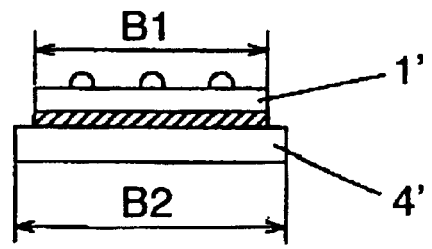
Figure 6D:
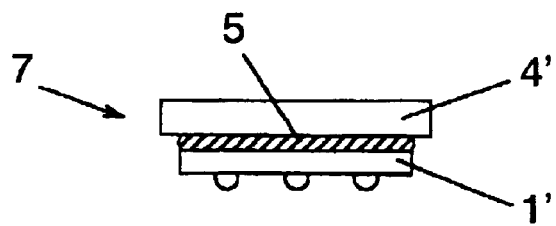

After the semiconductor elements is stuck, a holding sheet 6 for another dicing process is applied to an undersurface of the bumper plate 4, as shown in FIG. 6A, and the bumper plate 4 is thus held by the sheet 6 to be thereafter diced. In this process, as shown in FIG. 6B, after the sheet 3 is removed from the bump-formed surfaces of the elements 1', the bumper plate 4 has recesses of a dicing width b2 cut therein for dividing the plate 4 into discrete bumper members 4'. The width b2 is smaller than a dicing width b1 of the recesses is formed among the semiconductor elements 1'. Then, the bumper members 4', upon being bonded to respective element 1' with the adhesive 5, are each removed from the sheet 6. Consequently, similarly to FIG. 6C, discrete semiconductor devices 7, the same devices as in the embodiment 1, are obtained. The semiconductor devices 7 are then subjected to a taping process in the same manner as in the embodiment 1.

(Exemplary Embodiment 3)

Figure 7A:
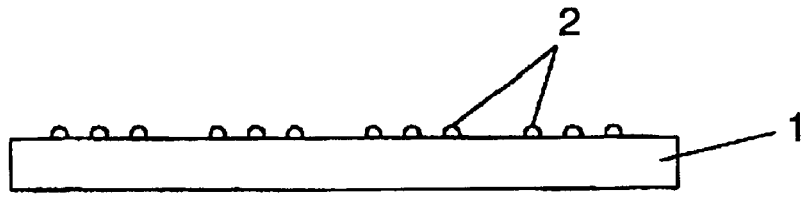
FIG. 7A through FIG. 7C illustrate processes in a method of manufacturing a semiconductor device in accordance with an exemplary embodiment 3 of the invention.
Figure 7B:
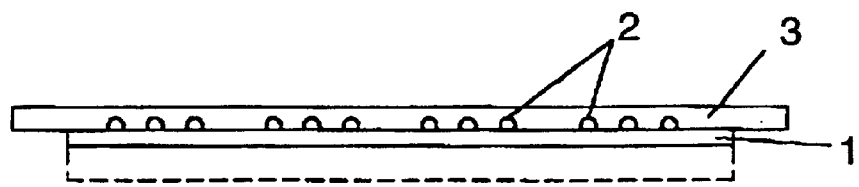
Figure 7C:
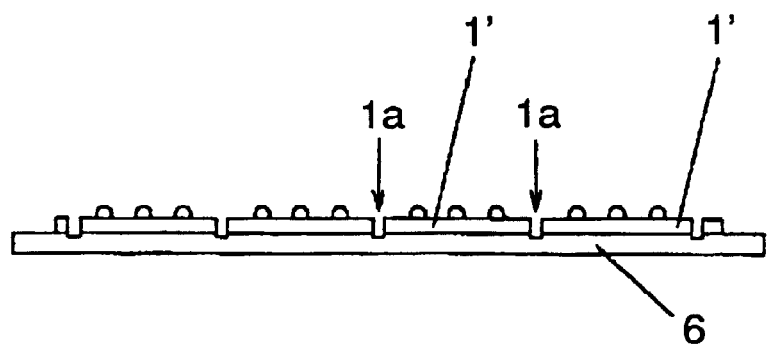
Figure 8A:
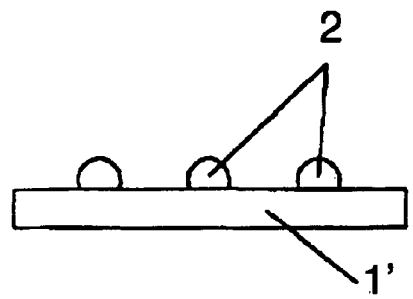
FIG. 8A through FIG. 8D illustrate processes in the method of manufacturing the semiconductor device in accordance with the embodiment 3.
Figure 8B:
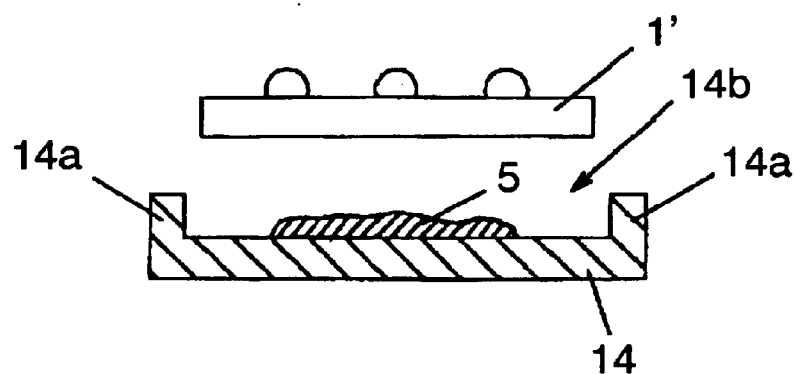
Figure 8C:
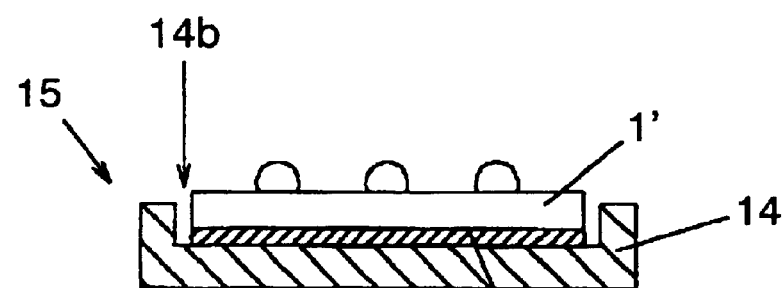
Figure 8D:
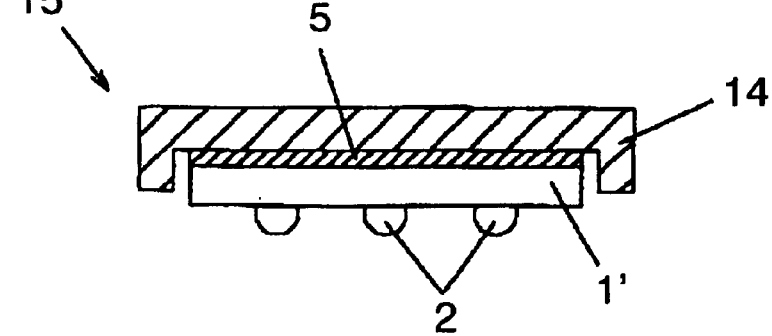
Figure 9A:
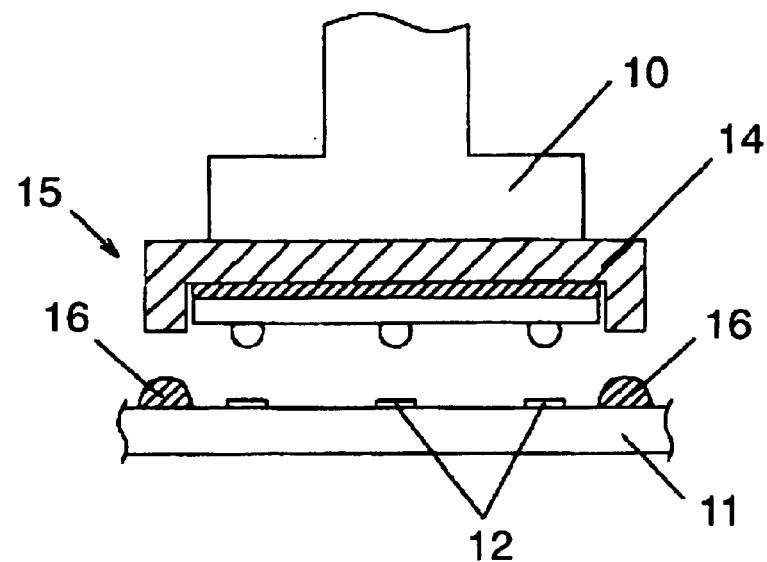
FIG. 9A and FIG. 9B illustrate processes of mounting the semiconductor device in accordance with the embodiment 3.
Figure 9B:
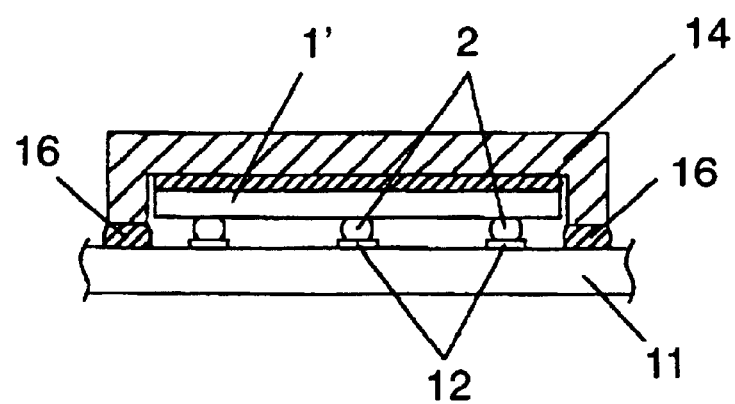

FIG. 7A through FIG. 7C and FIG. 8A through FIG. 8D illustrate processes in a method of manufacturing a semiconductor device in accordance with an exemplary embodiment 3 of the present invention. FIG. 9A and FIG. 9B illustrate processes of mounting the semiconductor device in accordance with the present embodiment. FIG. 7A through FIG. 7C and FIG. 8A through FIG. 8D illustrate the method of manufacturing the semiconductor device in order of procedure of the method.

In FIG. 7A, bumps 2, electrodes for external connections, are formed on a top surface of a semiconductor wafer 1 similarly to the embodiment 1 and embodiment 2. Subsequently, as shown in FIG. 7B, a sheet 3 is attached to a electrode-formed surface, which is the top surface of the wafer 1. The wafer then has an undersurface thinned while being reinforced with the sheet 3. Thus, the wafer 1 is thinned to a thickness of about 50 μm.

A holding sheet 6 for a dicing process is then attached to the undersurface of the semiconductor wafer 1, while the reinforcing sheet 3 used for the thinning is removed. Then, the wafer 1 held by the sheet 6 is subjected to the dicing process. In this process, diced grooves 1a are formed as shown in FIG. 7C, and the wafer 1 is then cut along the grooves and divided into semiconductor elements 1'. The elements 1' are removed from the sheet 6, and provided as shown in FIG. 8A.

Subsequently, the semiconductor element 1' is stuck to a bumper case 14. The bumper case 14, which is a reinforcing member used in the present embodiment, includes a projection 14a provided at a border of the case and a recess portion 14b formed at a portion to which the element 1' is bonded, as shown in FIG. 8B. An adhesive 5 made of the same material as that of the embodiment 1 is applied to the portion corresponding to the element 1' within the recess portion 14b. As shown in FIG. 8C, the element 1' is mounted at the recess portion 14b and bonded to the bumper case 14 with the adhesive 5. Consequently, a semiconductor device 15 is provided. The bumper case 14, upon being bonded to the element 1', has an edge of the projection 14a not project from tips of the bumps 2 of the element 1'.

The bumper case 14 functions as a holding member during handling the semiconductor device 15 and also functions as the reinforcing member to protect the semiconductor element 1' from external force and impact similarly to the embodiment 1 and embodiment 2. The bumper case 14 protects sides of the element 1' according to the present embodiment, thus improving reliability of the semiconductor device 15. The semiconductor device 15 is then inverted as shown in FIG. 8D and subjected to a taping process. Thus, the device 15 can be mounted with by an electronic component mounting apparatus.

Mounting the semiconductor device 15 will be described herein after while referring to FIG. 9A and FIG. 9B. As shown in FIG. 9A, the device 15, upon having a top surface of bumper case 14 sucked and held by a mounting head 10, is positioned above a substrate 11 by the head 10. In the present embodiment, an adhesive 16 is previously applied to a region (which corresponds to the projection 14a of the bumper case 14) surrounding electrodes 12 on a top surface of the substrate 11. The semiconductor device 15 has the bumps 2 aligned with respective electrodes 12 of the substrate 11, and then, the head 10 is lowered to have the bumps 2 of the semiconductor element 1' mounted on the electrodes 12.

Thus, the projection 14a of the bumper case 14 contacts with the adhesive 16 on the substrate 11. Subsequently, with being heated, the substrate 11 has the electrodes 12 bonded to the bumps 2 by soldering as shown in FIG. 9B. Then, the bumper case 14 is secured to the substrate 11 by the adhesive 16. As described above, even in this embodiment, the mounting head 10 holds the bumper case 14, which is a holding member, during handling of the semiconductor device 15.

In an assembly including the semiconductor device 15 mounted on the substrate 11, the device 15 is fixed to the substrate 11 through the bonding point of the bumps 2 of the device 15 and the respective electrodes 12 of the substrate as a workpiece, and through the bonding point of the border of the bumper case 14 and the substrate 11. Even in this assembly, the semiconductor element 1' is allowed to be deformed, and has the same advantages as those described in the embodiment 1 and embodiment 2.

Further, as shown in FIG. 9B, the semiconductor element 1' of the semiconductor device 15 has the top surface and the border entirely sealed after being mounted in the present embodiment. Therefore, the device 15 and electrodes 12 have junctions that are prevented from having moisture and extraneous matter entering therein, and thus, has an improved reliability after the mounting.

(Exemplary Embodiment 4)

Figure 10A:
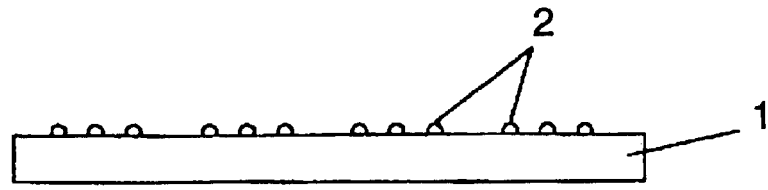
FIG. 10A through FIG. 10D illustrate processes in a method of manufacturing a semiconductor device in accordance with an exemplary embodiment 4 of the invention.
Figure 10B:
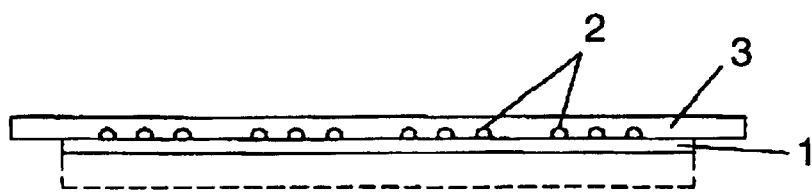
Figure 10C:
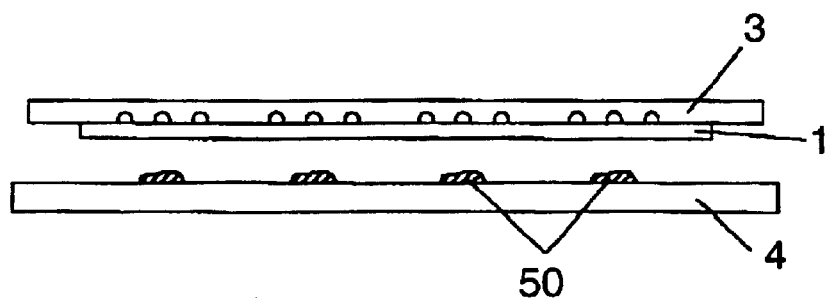
Figure 10D:
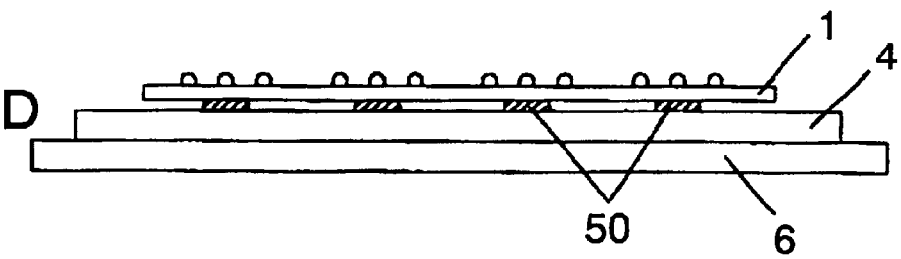
Figure 11A:
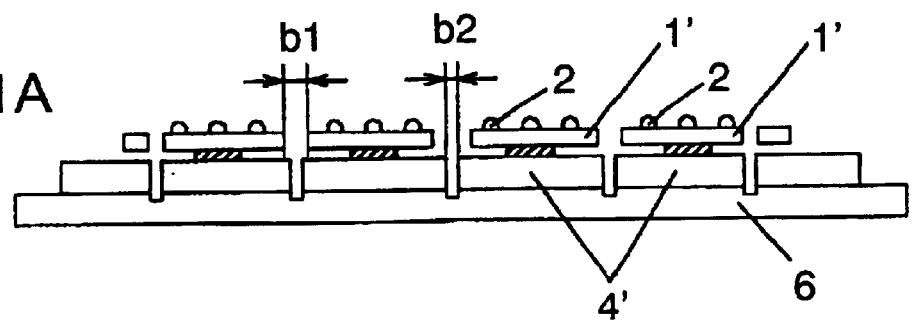
FIG. 11A through FIG. 11C illustrate processes in the method of manufacturing the semiconductor device in accordance with the embodiment 4.
Figure 12:
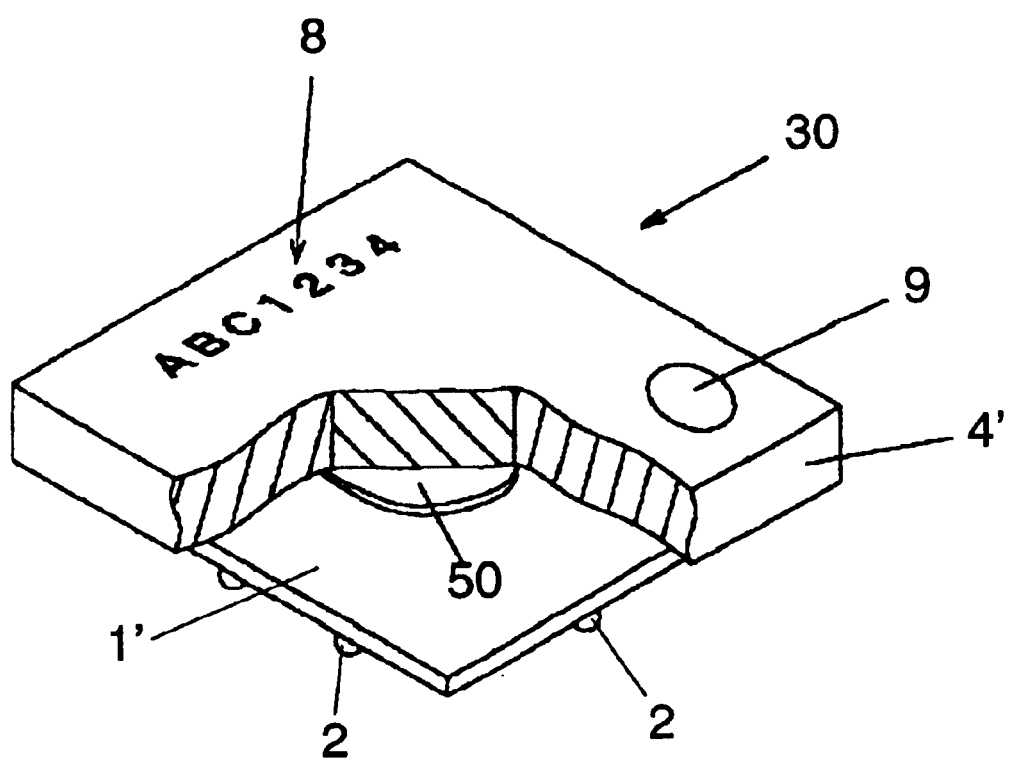
FIG. 12 is a perspective view of the semiconductor device in accordance with the embodiment 4.
Figure 13A:
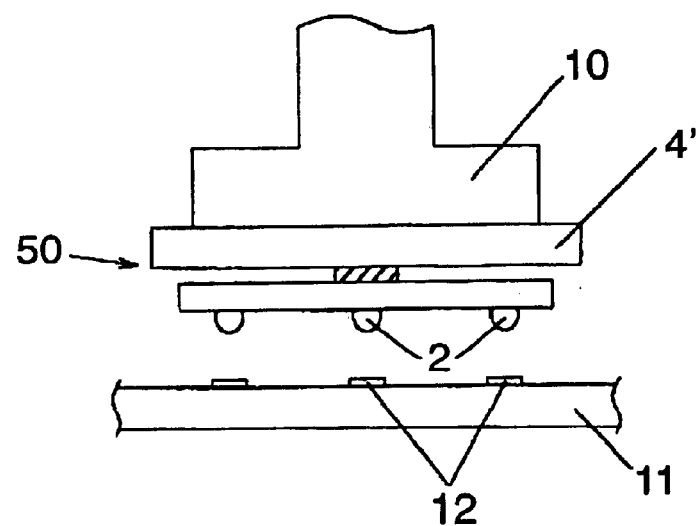
FIG. 13A through FIG. 13C illustrate processes of mounting the semiconductor device in accordance with the embodiment 4.
Figure 13B:
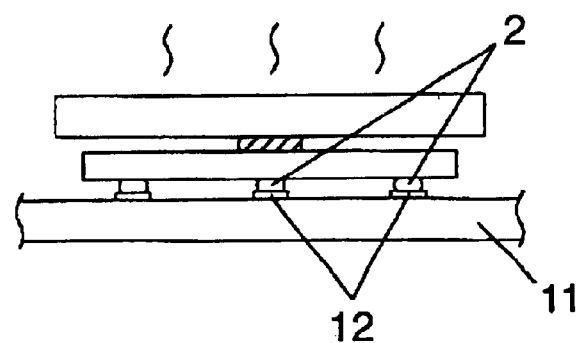
Figure 13C:
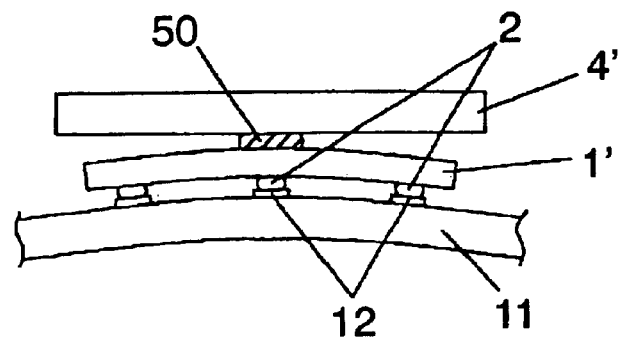

FIG. 10A through FIG. 10D and FIG. 11A through FIG. 11C illustrate processes in a method of manufacturing a semiconductor device in accordance with an exemplary embodiment 4 of the present invention. FIG. 12 is a perspective view of the semiconductor device. FIG. 13A through FIG. 13C illustrate processes of mounting the device. FIG. 10A through FIG. 10D and FIG. 11A through FIG. 11C illustrate the method of mounting the device in order of procedure of the method.

in FIG. 10A, bumps 2, electrodes for external connections, are formed on a top surface of a semiconductor wafer 1 including plural semiconductor elements formed therein. As shown in FIG. 10B, a sheet 3 is attached to a bump-formed surface (electrode-formed surface), which is the top surface of the wafer 1. And the wafer 1, upon being reinforced with the sheet 3, has a back surface opposite to the electrode-formed surface thinned. The wafer 1 may be thinned by shaving with a polishing machine having a grinding wheel, by etching with a dry etching apparatus, or by etching utilizing a chemical reaction of a chemical solution. The wafer 1 is thus thinned to a thickness of about 50 µm.

Subsequently, a bumper plate 4 is stuck to the back surface of the thinned semiconductor wafer 1. As shown in FIG. 10C, an adhesive 50 is applied on a top surface of bumper plate 4 at each portion corresponding to each semiconductor element of the wafer 1. The bumper plate 4 is formed by shaping a material such as resin, ceramic, metal or the like into a plate. In FIG. 10C, the adhesive 50 is applied to only a portion corresponding to a center of each semiconductor element. The adhesive 50 is made of resin having an elastic modulus lower than that of the bumper plate 4.

The bumper plate 4 functions as a holding member during handling of the semiconductor device after the semiconductor elements are separated from one another to form the semiconductor devices, respectively, and also functions as a bumper to protect the semiconductor elements from external force and impact. Accordingly, the bumper plate 4 has an enough thickness to exhibit greater flexural rigidity than the semiconductor element. After the bumper plate 4 is applied to the wafer 1, as shown in FIG. 10D, a reinforcing sheet 6 used for a dicing process is applied to an undersurface of the bumper plate 4, and then, the sheet 3 is peeled from the electrode-formed surface.

The bumper plate 4 and semiconductor wafer 1 both reinforced with the sheet 6 are then subjected to the dicing process. In the process, as shown in FIG. 11A, two-stage dicing is performed to cut the bumper plate 4 and wafer 1 with different dicing widths, respectively. Specifically, the wafer 1 is cut with a dicing width b1 and divided into discrete semiconductor elements 1', while bumper plate 4 is cut with a dicing width b2 narrower than the width b1 and divided into discrete bumper members 4'.

Figure 11B:
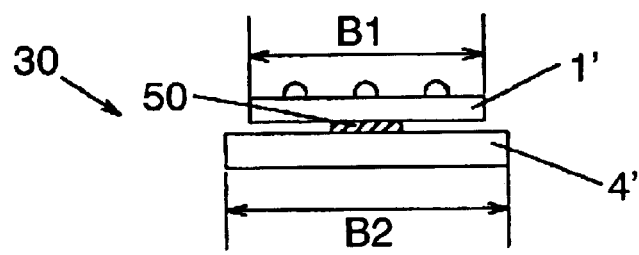
Figure 11C:
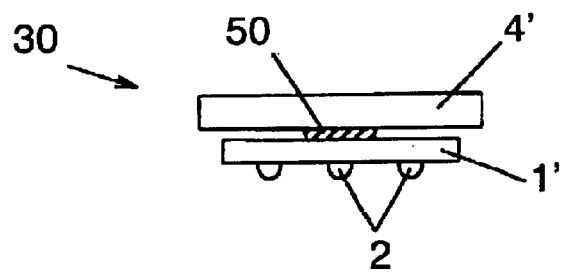

The sheet 6 is then peeled from the bumper members 4' bonded to respective semiconductor element 1' with the adhesive 50, and consequently, discrete semiconductor devices 30 are provided, similarly to FIG. 11B. Each device 30 includes the semiconductor element 1' having the bumps 2 functioning as electrodes for external connections, and the bumper member 4' functioning as a holding member during the handling. The holding member is bonded to the back surface opposite to the electrode-formed surface of the element 1' with the adhesive 50. A size B2 of the bumper member 4' is larger than a size B1 of the semiconductor element 1', and therefore, an outer edge of the bumper member 4' protrudes more outward than an outer edge of the element 1'. Only the center of semiconductor element 1' is bonded to the corresponding portion of the bumper member 4' with the adhesive 50. The semiconductor device 30, since having an outer border of the semiconductor element 1' free against the bumper member 4', is resistant to warping even if the element 1' and bumper member 4' have there sizes change due to thermal expansion.

As shown in FIG. 12, the bumper member 4' may include a part code 8 as identification information printed on a top surface thereof and a polarity mark 9 indicative of a mounting direction printed at a corner thereof similarly to a conventional resin-sealed electronic component. In other words, a reverse surface, positioned opposite to a junction of the bumper member 4' and semi conductor element 1', of bumper member 4' is a surface to which the identification information is applied. Then, the discrete semiconductor device 30 is inverted to have the bumper member 4' face upward, and then, is subjected to a taping process to hold the device with a tape for supplying electronic components. Thus, the device 30 can be mounted with an electronic component mounting apparatus.

Instead of the semiconductor element 1', a dummy semiconductor device made of a silicon plate having a thickness of 50 µm was subjected to a drop test in which the device was dropped from a height of 1 m. As a result, damage such as fracture or the like did not occur to the silicon plate at all. According to this fact, it is confirmed that no problem occurs even if the semiconductor device in accordance with the present embodiment is handled in the same manner as an ordinary electronic component. The semiconductor device 30 can employ an extremely thin semiconductor element, which is hardly handled when being used in a conventional resin-sealed device, because the device 30 has a simple structure in which the bumper member 4' is simply attached to the center of the semiconductor element 1' with the adhesive 50.

Referring to FIG. 13A through FIG. 13C, mounting the semiconductor device 30 will be described. As shown in FIG. 13A, the device 30, having a top surface of the bumper member 4' by a mounting head 10, is sucked and positioned above a substrate 11 by the head 10. After the device has the bumps 2 aligned with respective electrodes 12 of the substrate 11, the mounting head 10 is then lowered to mount the bumps 2 of the semiconductor element 1' on the electrodes 12, respectively.

Subsequently, the substrate 11, with being heated, has the electrodes 12 bonded to the bumps 2 by soldering. As described above, the mounting head 10 holds the bumper member 4', which is the holding member, during handling to mount the semiconductor device 30 on the substrate 11. The bumps 2 may be bonded to respective electrodes 12 by a conductive resin adhesive.

In an assembly including the semiconductor device 30 mounted on the substrate 11, the device 30 is fixed to the substrate through the bonding of the bumps 2 of the device 30 to the electrodes 12 of the substrate 11 as a workpiece. As shown in FIG. 13C, when the substrate 11 is deformed by an external force after the mounting, only the semiconductor element 1' is deformed in response to the deformation of the substrate 11 because the element 1' is thin and is easily bent. In the present embodiment, the element 1' has only the center bonded to the bumper member 4', and thus, can be deformed without being restrained by the bumper member 4'.

Moreover, an extremely thin semiconductor element having a thickness of 100 μm or less, upon being employed in the semiconductor device in accordance with this embodiment, accepts a reduced stress on bumps 2 due to a difference between thermal expansion coefficients of the semiconductor element 1' and substrate 11. In a conventional electronic component (semiconductor device) having a bump, since a thick semiconductor element is employed, accepts an excess stress on the bump, and thus, the component may cause disconnection between the bump and an electrode of a substrate. For this reason, an underfill resin or the like is needed for reinforcement between the electronic component and the substrate. However, the extremely thin semiconductor element 1' in accordance with the present embodiment, after being bonded, reduces a stress on a junction of the semiconductor device 30 and substrate 11 without reinforcement such as the underfill resin. In addition, the semiconductor device 30 has a simple package structure including the semiconductor element 1' and the bumper member 4' simply bonded together with the adhesive 50, thus having an ensured reliability after this device 30 is mounted.

(Exemplary Embodiment 5)

FIG. 14A through FIG. 14D and FIG. 15A through FIG. 15D illustrate processes in a method of manufacturing a semiconductor device in accordance with an exemplary embodiment 5 of the present invention, and illustrate the method in order of procedure thereof.

Figure 14A:
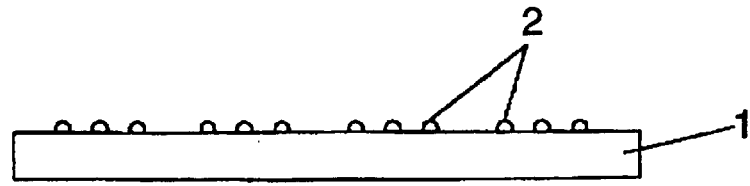
FIG. 14A through FIG. 14D illustrate processes in a method of manufacturing a semiconductor device in accordance with an exemplary embodiment 5 of the invention.
Figure 14B:
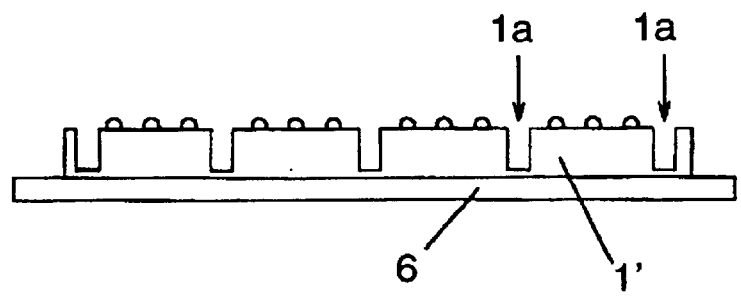
Figure 14C:
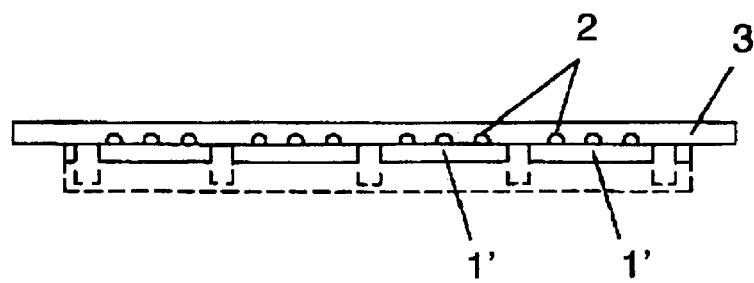
Figure 14D:
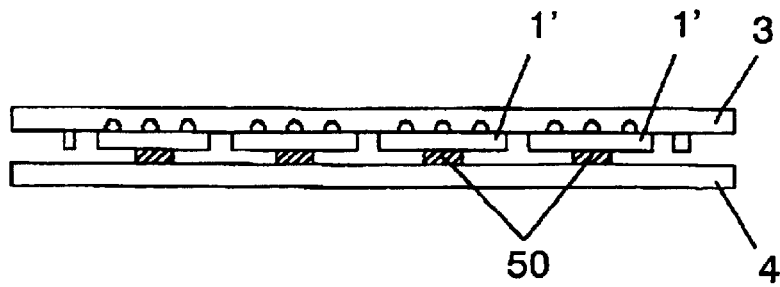
Figure 15A:
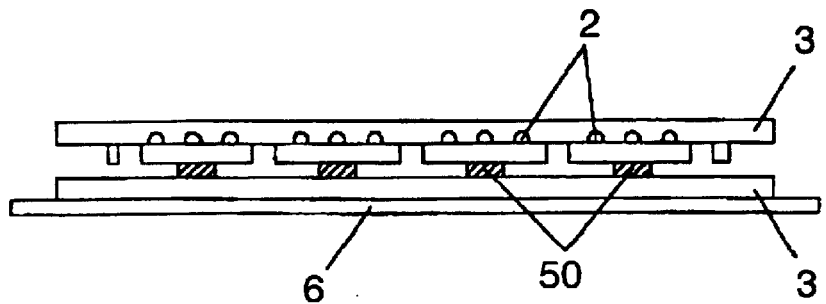
FIG. 15A through FIG. 15D illustrate processes in the method of manufacturing the semiconductor device in accordance with the embodiment 5.
Figure 15B:
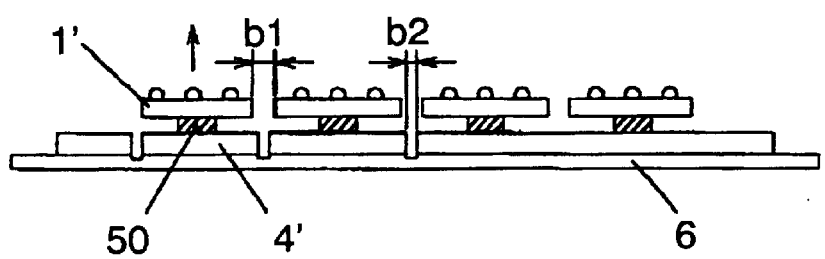
Figure 15C:
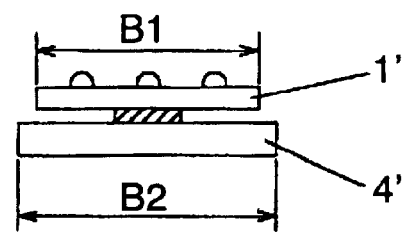
Figure 15D:
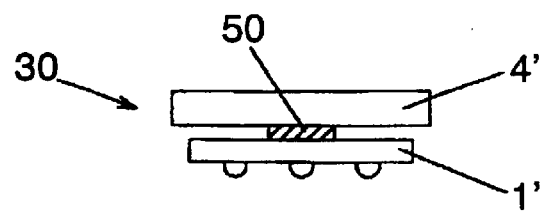
Figure 16A:
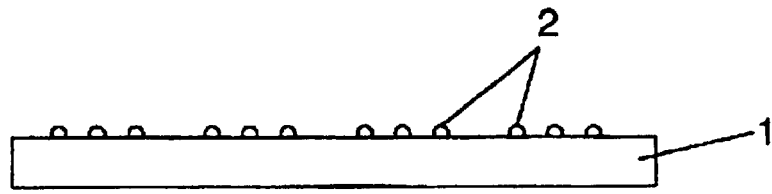
FIG. 16A through FIG. 16C illustrate processes in a method of manufacturing a semiconductor device in accordance with an exemplary embodiment 6 of the invention.
Figure 16B:
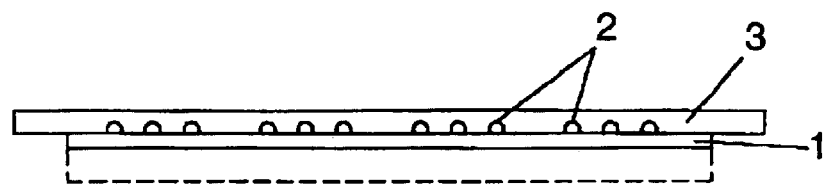
Figure 16C:
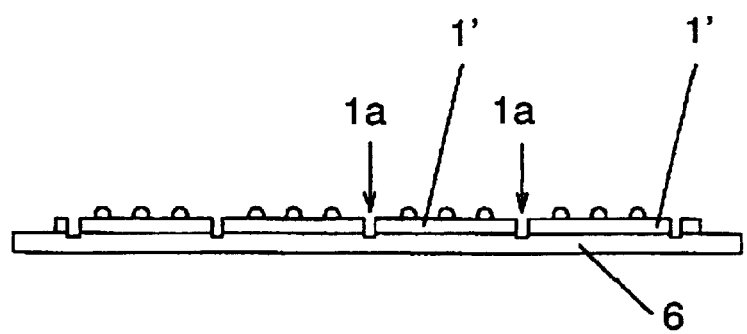

The present embodiment is substantially the same as the embodiment 2 except for the process of sticking the semiconductor element 1' to the bumper plate 4 with an adhesive. As shown in FIG. 14D, the semiconductor element 1' are stuck to the bumper plate 4. In this process, an adhesive 50 is applied to each portion corresponding to each element 1' on a top surface of the bumper plate 4, and a thinned semiconductor element 1' is stuck to a surface coated with the adhesive 50. In this drawing, the adhesive 50 is applied to only the portion corresponding to a center of each semiconductor element, and is made of material having an elastic modulus lower than the bumper plate 4.

The rest of the procedure for obtaining the semiconductor devices 30 is the same as that of the embodiment 2.

(Exemplary Embodiment 6)

Figure 17A:
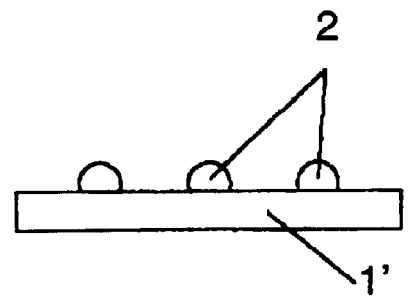
FIG. 17A through FIG. 17D illustrate processes in the method of manufacturing the semiconductor device in accordance with the embodiment 6.
Figure 17B:
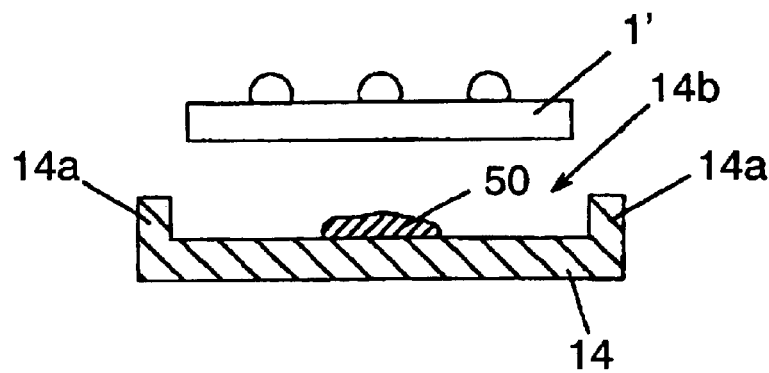
Figure 17C:
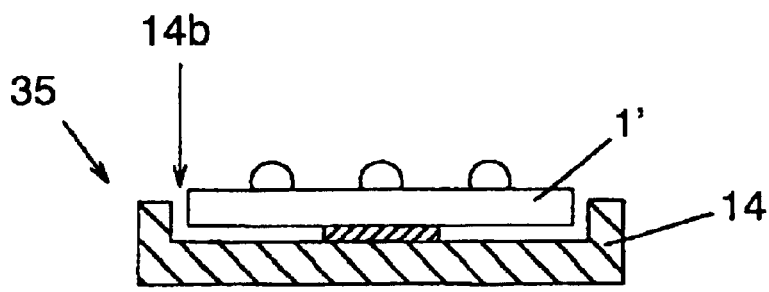
Figure 17D:
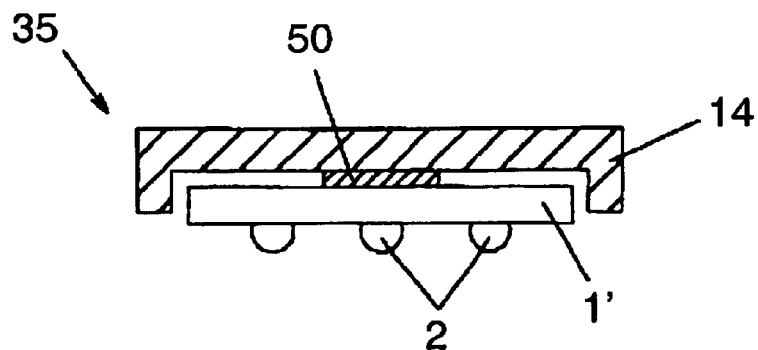
Figure 18A:
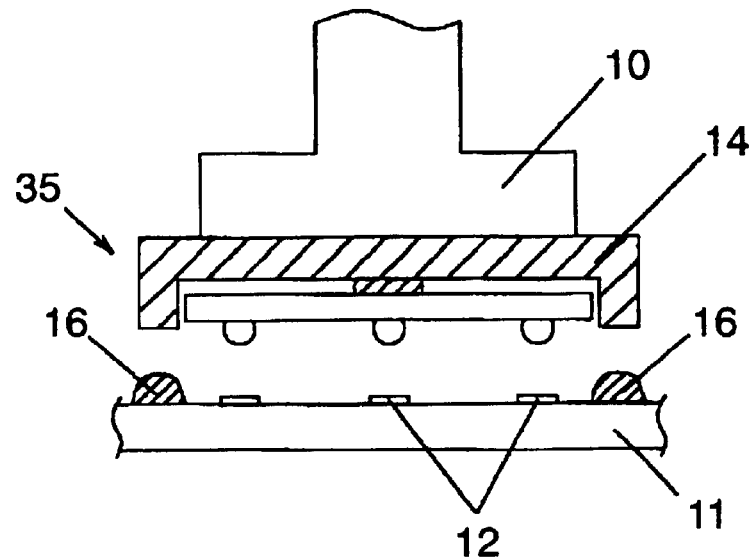
FIG. 18A and FIG. 18B illustrate processes of mounting the semiconductor device in accordance with the embodiment 6.
Figure 18B:
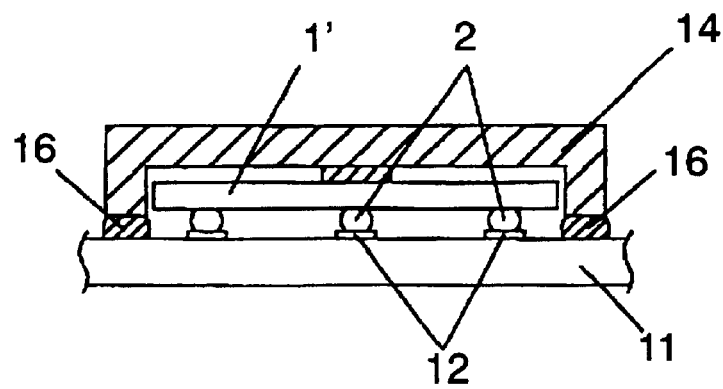

FIG. 16A through FIG. 16C and FIG. 17A through FIG. 17D illustrate processes in a method of manufacturing a semiconductor device in accordance with an exemplary embodiment 6 of the present invention, and illustrate the method in order of procedure thereof. FIG. 18A and FIG. 18B illustrate processes of mounting the semiconductor device.

The present embodiment is substantially the same as the embodiment 3 except for the process of sticking each semiconductor element 1' to the bumper case 14 with an adhesive. The adhesive 50 is applied to only a portion of the recess portion 14b corresponding to a center of the element 1'. As shown in FIG. 17C, the element 1' is mounted at the recess portion 14b, the adhesive 50 bonds the bumper case 14 to the element 1', and consequently, a semiconductor device 35 is provided. The bumper case 14 bonded to the element 1' has an edge of a projection 14a not projecting from a tip of the bump 2 of the element 1'.

The bumper case 14 functions as a holding member during in handling of the semiconductor device 35, and also functions as a bumper to protect the semiconductor element 1' from external force and impact similarly to the embodiment 4. Moreover, the bumper case 14 protects a side of the element 1' in this embodiment, thus improving reliability of the semiconductor device 35. As shown in FIG. 17D, the semiconductor device 35 is then inverted and subjected to a taping process. Thus, the device 35 can be mounted by an electronic component mounting apparatus.

With referring to FIG. 18A and FIG. 18B, mounting the semiconductor device 35 will be described. As shown in FIG. 18A, the device 35, having a top surface of bumper case 14 sucked and held by a mounting head 10, is positioned above a substrate 11 by the head 10. In the present embodiment, an adhesive 16 is previously applied to a region (which corresponds to the projection 14a of the bumper case 14) surrounding electrodes 12 on a top surface of the substrate 11. With the bumps 2 of the device 35 aligned with respective electrodes 12 of the substrate 11, the head 10 is then lowered to mount the bumps 2 of the semiconductor element 1' on the electrodes 12.

Thus, the projection 14a of the bumper case 14 contacts with the adhesive 16 on the substrate 11. Subsequently, the substrate 11, upon being heated, has respective electrodes 12 bonded to the bumps 2 by soldering as shown in FIG. 18B, and thus, the bumper case 14 is secured to the substrate 11 by the adhesive 16. As described above, even in this embodiment, the mounting head 10 holds the bumper case 14, which is the holding member, during the handling of the semiconductor device 35.

In an assembly including the semiconductor device 35 mounted on substrate 11, the device 35 is fixed to the substrate 11 through the bonding of bumps 2, as electrodes of device 35, to respective electrodes 12 of the substrate 11 as a workpiece, and through the bonding of a border of the bumper case 14 to the substrate 11. Even in this assembly, the semiconductor element 1' can be deformed, and the same advantage as that of the semiconductor element described in the embodiment 4 is obtained.

Further, as shown in FIG. 18B, the semiconductor element 1' of the semiconductor device 35 has a top surface and border entirely sealed after being mounted in the present embodiment. Therefore, the device is protected from moisture and extraneous matter entering junctions of the device 35 and electrodes 12, and thus has an improved reliability after the mounting.

What is claimed is:

1. A semiconductor device comprising:
   a semiconductor element including an electrode formed on an electrode-formed surface thereof;
   a reinforcing member bonded to a back surface of said semiconductor element, said back surface being opposite to said electrode-formed surface; and
   an adhesive bonding said semiconductor element and said reinforcing member while allowing said semiconductor element to be deformed,
   wherein said reinforcing member has a flexural rigidity greater than a flexural rigidity of said semiconductor element.

2. The semiconductor device of claim 1, wherein said adhesive is made of resin having a low elastic modulus, and bonds said back surface of said semiconductor element entirely to said reinforcing member.

3. The semiconductor device of claim 1, wherein said adhesive bonds only a center of said back surface of said semiconductor element to said reinforcing member.

4. The semiconductor device of claim 1, wherein said reinforcing member is larger than said semiconductor element in outside shape.

5. The semiconductor device of claim 4, wherein said reinforcing member includes:
   a recess portion to which said semiconductor element is bonded; and
   a projection formed at a border of said recess portion.

6. The semiconductor device of claim 1, wherein said reinforcing member functions as a holding member in handling.

7. The semiconductor device of claim 1, wherein identification information is applied to an applied surface of said reinforcing member, said applied surface being opposite to a surface of said reinforcing member bonded to said semiconductor element.

8. The semiconductor device of claim 1, wherein said semiconductor element has a thickness not greater than 100 μm.

9. A method of manufacturing a semiconductor device, said method comprising:
   shaving a back surface of a semiconductor wafer, the back surface being opposite to an electrode-formed surface of the semiconductor wafer including a plurality of semiconductor elements therein;
   bonding a reinforcing plate to the shaved back surface of the semiconductor wafer with an adhesive; and
   dividing the semiconductor wafer to which the reinforcing plate is bonded and the reinforcing plate into units of the semiconductor elements, the reinforcing plate being operable to be held by a mounting head when the semiconductor elements are being mounted to a substrate,
   wherein said dividing of the semiconductor wafer and the reinforcing plate comprises dividing the reinforcing plate with a dicing width smaller than a dicing width of the semiconductor wafer.

10. The method of claim 9, further comprising forming a bump on the electrode-formed surface of the semiconductor wafer.

11. The method of claim 9, wherein said shaving of the back surface of the semiconductor wafer comprises shaving the back surface of the semiconductor wafer until the semiconductor wafer has a thickness of not greater than 100 μm.

12. A method of manufacturing a semiconductor device, said method comprising:
   shaving a back surface of a semiconductor wafer, the back surface being opposite to an electrode-formed surface of the semiconductor wafer including a plurality of semiconductor elements therein;
   bonding a reinforcing plate to the shaved back surface of the semiconductor wafer with an adhesive;
   dividing the semiconductor wafer to which the reinforcing plate is bonded and the reinforcing plate into units of the semiconductor elements, the reinforcing plate being operable to be held by a mounting head when the semiconductor elements are being mounted to a substrate; and
   attaching a sheet to the electrode-formed surface of the semiconductor wafer, wherein said shaving of the back surface of the semiconductor wafer comprises shaving the back surface of the semiconductor wafer while the sheet is attached to the electrode-formed surface of the semiconductor wafer.

13. The method of claim 12, further comprising forming a bump on the electrode-formed surface of the semiconductor wafer.

14. The method of claim 12, wherein said shaving of the back surface of the semiconductor wafer comprises shaving the back surface of the semiconductor wafer until the semiconductor wafer has a thickness of not greater than 100 μm.

15. A method of manufacturing a semiconductor device, said method comprising:
   forming a diced groove along a border between a plurality of semiconductor elements from an electrode-formed surface of a semiconductor wafer which includes the semiconductor elements formed therein;
   attaching a sheet to the electrode-formed surface of the semiconductor wafer having the diced groove;
   dividing the semiconductor wafer into the semiconductor elements by shaving a back surface of the semiconductor wafer to thin the semiconductor wafer to a thickness until the shaved back surface reaches the diced groove, the back surface being opposite to the electrode-formed surface to which the sheet is attached; bonding a reinforcing plate to the back surface of the semiconductor elements with an adhesive; and
   dividing the reinforcing plate into units corresponding to the semiconductor elements after removing the sheet from the electrode-formed surface.

16. The method of claim 15, wherein said dividing of the reinforcing plate comprises dividing the reinforcing plate with a dicing width smaller than the diced groove of the semiconductor wafer.

17. The method of claim 15, wherein said shaving of the back surface of the semiconductor wafer comprises shaving the back surface of the semiconductor wafer until the semiconductor wafer has a thickness of not greater than 100 μm.

18. A method of manufacturing a semiconductor device, said method comprising:
   shaving a back surface of a semiconductor wafer, the back surface being opposite to an electrode-formed surface of the semiconductor wafer which includes a plurality of semiconductor elements;
   dividing the semiconductor wafer into the semiconductor elements;
   bonding a reinforcing member to a back surface of each of the semiconductor elements with an adhesive, the reinforcing member being operable to be held by a mounting head when the semiconductor elements are being mounted to a substrate; and
   attaching a sheet to the electrode-formed surface of the semiconductor wafer, wherein said shaving of the back surface of the semiconductor wafer comprises shaving the back surface of the semiconductor wafer to which the sheet is attached.

19. The method of claim 18, further comprising forming a bump on the electrode-formed surface of the semiconductor wafer.

20. The method of claim 18, wherein said shaving of the back surface of the semiconductor wafer comprises shaving the back surface of the semiconductor wafer until the semiconductor wafer has a thickness of not greater than 100 μm.

21. A method of mounting a semiconductor device which includes:
- a semiconductor element having an electrode-formed surface;
- a reinforcing member bonded to a back surface of the semiconductor element that allows the semiconductor element to be deformed, the back surface being opposite the electrode-formed surface; and
- an adhesive bonding the semiconductor element to the reinforcing member,
- wherein said reinforcing member has a flexural rigidity greater than a flexural rigidity of said semiconductor element, said method comprising:

holding the reinforcing member; and mounting the semiconductor device to a workpiece, the semiconductor device having the reinforcing member held.

22. The method of claim 21, wherein the reinforcing member includes a recess portion to which the semiconductor element is bonded and a projection formed at a border of the recess portion, and wherein said mounting of the semiconductor device comprises bonding the projection to the workpiece.

23. The method of claim 21, wherein the semiconductor element has a thickness of not greater than 100 $\mu$m.

* * * * *

UNITED STATES PATENT AND TRADEMARK OFFICE
CERTIFICATE OF CORRECTION

PATENT NO. : 6,797,544 B2
DATED : September 28, 2004
INVENTOR(S) : Tadahiko Sakai et al.

It is certified that error appears in the above-identified patent and that said Letters Patent is hereby corrected as shown below:

Title page,
Item [56], References Cited, U.S. PATENT DOCUMENTS, please insert the following reference:
-- 6,064,114 5/2000 Higgins, III --
FOREIGN PATENT DOCUMENTS, please insert the following reference:
-- JP 11-251360 9/1999
  JP 2001-203298 7/2001 --

Signed and Sealed this

Eighth Day of March, 2005

JON W. DUDAS
*Director of the United States Patent and Trademark Office*